United States Patent [19]

Sakamoto

[11] Patent Number: 5,058,074
[45] Date of Patent: Oct. 15, 1991

[54] INTEGRATED CIRCUIT INCLUDING PROGRAMMABLE CIRCUIT

[75] Inventor: Makoto Sakamoto, Chiba, Japan
[73] Assignee: Kawasaki Steel Corporation, Japan
[21] Appl. No.: 480,890
[22] Filed: Feb. 16, 1990

[30] Foreign Application Priority Data

Jun. 21, 1989 [JP] Japan ................................. 1-159293

[51] Int. Cl.[5] ............................................. G11C 14/00
[52] U.S. Cl. .................................... 365/228; 365/236; 365/233
[58] Field of Search ...................... 365/228, 233, 236

[56] References Cited

U.S. PATENT DOCUMENTS 4,761,647 8/1988 Hallenbeck et al. ............ 340/825.22

FOREIGN PATENT DOCUMENTS 0055348 7/1982 European Pat. Off. .
0238230 9/1987 European Pat. Off. .
0287337 10/1988 European Pat. Off. .
0307912 3/1989 European Pat. Off. .

OTHER PUBLICATIONS

IEEE Journal of Solid-State Circuits, vol SC21, No. 5, Oct. 1986, Sau-Ching Wong et al., "Novel Circuit Techniques for Zero-Power 25-ns CMOS Erasable Programmable Logic Devices (EPLD's)", pp. 766-773.

Primary Examiner—Joseph A. Popek
Attorney, Agent, or Firm—Oliff & Berridge

[57] ABSTRACT

In an integrated circuit comprising a programmable circuit and a non-volatile chip formed on the same chip, a volatile memory, instead of the non-volatile memory, is disposed within the programmable circuit, and a circuit is further provided for transferring program data between the non-volatile memory and the volatile memory. By placing the non-volatile memory outside the programmable circuit, the interior of the programmable circuit is not exposed to the high voltage required for writing to the non-volatile memory, and program data can be rapidly and easily transfered between the memories.

4 Claims, 2 Drawing Sheets

INTEGRATED CIRCUIT INCLUDING PROGRAMMABLE CIRCUIT

BACKGROUND OF THE INVENTION

1. Field of the Invention:

The present invention relates to an integrated circuit including therein a programmable circuit such as a programmable logic device (PLD), etc.

2. Description of the Prior Art:

There are conventionally known PLDs (programmable logic devices) and the like which are integrated circuits (IC) capable of being manually programmed by a user to realize a desired circuit. These programmable integrated circuits require that program data corresponding to specifications for logic configurations of the PLDs and circuits, etc. be stored therein. They therefore sometimes include within the logic circuit, a circuit incorporating a non-volatile memory device such as an EPROM (erasable programmable read only memory) or an EEPROM (electrically erasable programmable read only memory). Such an IC is disclosed, for example, in *IEEE Journal of Solid-State Circuits*, Vol. SC-21, No. 5, October, 1986, pp. 766-773.

There is also another programmable IC which includes a volatile memory device such as an SRAM (static random access memory) for holding program data and transferring the program data from an EPROM or an EEPROM of an external memory IC upon power-up or when the data is needed by volatile memory device.

Such prior programmable ICs, which include non-volatile memory devices, however, suffer from a reduced degree of integration. More specifically, with a non-volatile memory device such as an EPROM integrated in the logic circuit to hold the program data, a high write voltage must be applied to the memory device in order to write program data thereto. It is accordingly necessary to separate the logic circuit and the non-volatile memory device from each other in order to avoid the logic circuit components from being destroyed and latched up during a write separation, which causes the degree of integration of the logic circuit to be lowered. Accordingly, only a few types of programmable logic such as a PLA (programmable logic array), can integrally be incorporated in the logic circuit with the non-volatile memory device. The difficulty described above with respect to the writing is not experienced by a logic device that instead includes a volatile memory device. In this situation, although the logic circuit does not suffer from a reduced degree of integration, it requires an extra external non-volatile memory device which lowers the degree of on-board integration.

To solve such problems, Japanese Laid-Open Patent Publication No. 64-78023 proposes an integrated circuit including therein a non-volatile memory device independent of a volatile memory device. The circuit cannot, however, directly transfer program data from an external source to the volatile memory device, and also requires that the program data be held in the non-volatile memory device. In particular, the circuit is difficult to use for circuit evaluation such as shipping inspection and in-circuit emulation. The circuit is also costly.

SUMMARY OF THE INVENTION

In view of the above drawbacks with the prior art, it is an object of the present invention to provide a handy and economical integrated circuit having an improved degree of integration and in which program data is easily altered for circuit evaluation such as shipping inspection and in-circuit emulation by providing therein a programmable circuit and a non-volatile memory device for storing the program data.

To achieve the above object, an integrated circuit according to the present invention comprises a volatile memory device disposed in a programmable circuit on a chip for storing program data concerning the programmable circuit, a non-volatile memory device is disposed outside the programmable circuit on the chip, the non-volatile memory device permitting the program data to be written therein from a source external to the chip. A circuit is also provided for selectively transferring either program data written in the non-volatile memory device or program data supplied from an external source to the volatile memory device.

In addition, the circuit for selectively transferring the program data advantageously also includes a circuit for selectively transferring the program data stored in the volatile memory device to the non-volatile memory device.

In the integrated circuit according to the present invention, including therein a programmable circuit and a non-volatile memory device, it is noted that the degree of integration is lowered due to the fact that the programmable circuit does not include therein the non-volatile memory device to which high voltage must be applied for writing thereto. The integrated circuit of the preset invention obtains a lower degree of integration and better performance that the prior art circuits by placing a volatile memory device in the programmable circuit instead of the non-volatile memory device, by placing the non-volatile memory device on the same chip, but outside the programmable circuit, and further by transferring the program data to the volatile memory device disposed in the programmable circuit when needed. Accordingly, since the non-volatile memory device which causes the lower degree of integration is laid out as a separate block from the programmable circuit, the degree of integration of the programmable circuit is improved together with that of the whole integrated circuit. The inter-circuit capacitance among the constituent circuits is also reduced which speeds up the operation of the whole integrated circuit and improves the performance thereof.

Additionally, since there is included in the integrated circuit of the present invention, a transfer circuit having a function of selectively transferring program data from an external source instead of the non-volatile memory device forming part of the integrated circuit, the integrated circuit serves either as a programmable integrated circuit of the type in which program data such as specifications for logic configurations of the programmable logic circuit are stored in a non-volatile manner for use in configuring the programmable circuit as a fixed logic circuit upon its being, or as a programmable integrated circuit of the type in which such program data is stored in an external source, such as a magnetic recording medium and the like, for use in configuring the programmable logic circuit as a variable logic circuit. The integrated circuit of the present invention is used as either a fixed logic circuit or a variable logic circuit without additional switching circuitry. The logic circuits arrangement, fixed or variable, is determined by where the program data is stored.

Moreover, since the integrated circuit of the present invention is capable of directly transferring not only the program data written in the non-volatile memory device but also program data supplied from an external source via a to said volatile memory device, program data within the programmable circuit can thus be altered easily and the resultant configured circuit tested during circuit evaluation such as occurs during a shipping inspection, in-circuit emulation, etc., without storing program data in the non-volatile memory device for each test. The present invention is thus easy to use and economical.

Furthermore, when the transfer circuit includes a circuit for transferring the program data stored in the volatile memory device to the non-volatile memory device, program data for a circuit stored in the volatile memory device, can be written in the non-volatile memory device through the transfer circuit, once the circuit has been evaluated and tested during a shipping inspection, in-circuit emulation, etc. This makes the non-volatile memory write operation rapid and easy, and also improves the integrated circuit design and inspection efficiency.

BRIEF DESCRIPTION OF THE DRAWINGS

The exact nature of this invention, as well as other objects and advantages thereof will be readily apparent from the following detailed description of preferred embodiments, with reference to the accompanying drawings, in which like reference characters designate the same or similar parts throughout the figures thereof, and wherein.

DESCRIPTION OF THE PREFERRED EMBODIMENT

Figure 1:
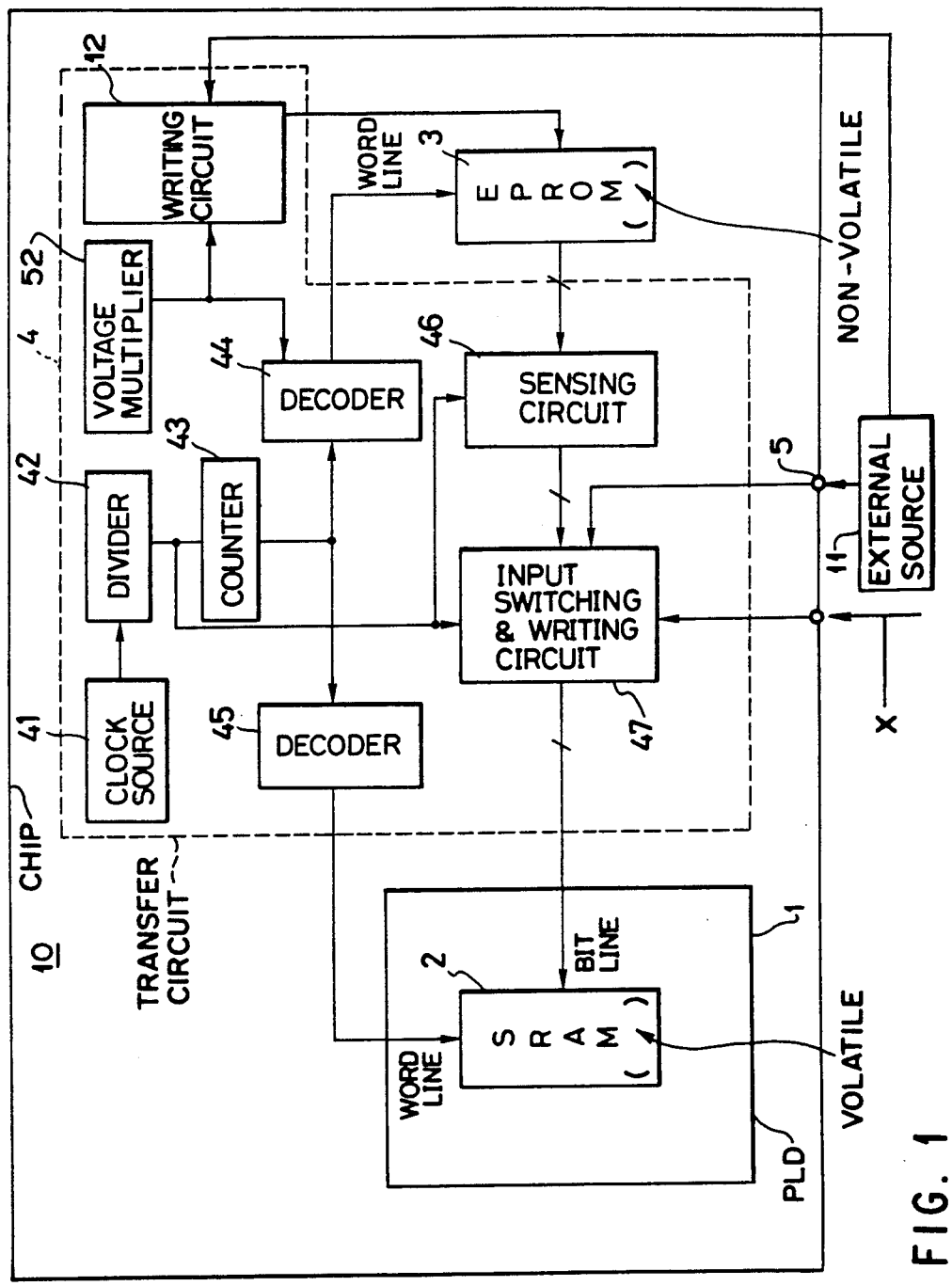
FIG. 1 is a block diagram illustrating the construction of a first embodiment of an integrated circuit according to the present invention.

Referring to FIG. 1, the construction of a first embodiment of an integrated circuit of the present invention is illustrated in the form of a block diagram. The present embodiment includes a programmable logic circuit (PLC) 1 formed on a chip 10, at least one SRAM 2 disposed in the PLC 1 at a desired location on a chip 10, a corresponding at least one EPROM 3 disposed at another location on the same chip 10, but outside the PLC 1, and a transfer circuit 4 for transferring program data for the programmable logic corresponding to the specifications and selectors for a particular logic configuration of circuit PLC 1 written in the EPROM 3 when needed, e.g., at power-up, to SRAM 2 in the PLC 1. Additionally, a write circuit 12 and associated voltage multiplier 52 for writing program data into the EPROM 3 are also provided.

The transfer circuit 4 includes a clock source 41, a frequency divider circuit 42 for dividing a clock signal generated by the clock source 41 to generate a second clock signal, a counter 43 for counting the second clock signal and generating an address in synchronism with the second clock signal, a decoder 44 for decoding the address as a read address to select a word line of the EPROM 3, a decoder 45 for decoding the address as a write address to select a word line of the SRAM 2, a sensing circuit 46 for reading data stored in the EPROM 3 in synchronism with the second clock signal, and an input switching/writing circuit 47 for selecting either program data read from the sensing circuit 46 or program data inputted from an external source 11, via a terminal 5 responsive to a control signal X generated externally of said chip 10 for driving a bit line of the SRAM 2.

In the above construction, the clock source 41 and the frequency divider circuit 42 may be omitted, and the clock signal which the present integrated circuit requires may be provided from an external source. In addition, the sensing circuit 46 may sometimes be omitted depending upon the construction of the non-volatile memory device.

Operation of the first embodiment constructed as described above is as follows.

In the present embodiment, the EPROM 3, which is an example of the non-volatile memory device, is disposed on the same chip 10 as the programmable logic circuit 1, but outside the programmable logic circuit 1, as a separate circuit block in order to prevent high voltage from being applied to the programmable logic circuit 1 upon writing into the EPROM 3. However, the memory device for storing the program data, such as specifications of logic configuration for PLC 1, must also be located near the programmable logic circuit 1 so that read speed is not decreased and to accommodate routing and layout requirements for the integrated circuit wiring. In the present embodiment, the location of SRAM 2, which is an example of the volatile memory device, within PLC 1 satisfies these requirements. Hence, program data can be transferred from the EPROM 3 to the SRAM 2 through the transfer circuit 4 in synchronism with the same clock when it is needed, e.g., during power-up.

Thus, in the programmable logic circuit 1, of the present invention, the limitation caused by the need to separate the circuits to prevent high voltages from being applied to the PLC 1 is removed, which compensates for the additional area required by the SRAM 2, so that the overall degree of integration of chip 10 is increased. Additionally, since the transfer circuit 4 is included in the integrated circuit 10, the program data can be transferred with ease from an external source 11. This is preferable for use in the control of machine tools and the like, wherein memory resources, such as a floppy disk, are desirable in order to alter program data depending on machining conditions. Thus, one integrated circuit is useable for a plurality of such applications.

Next, a second embodiment of the present invention will be described.

Figure 2:
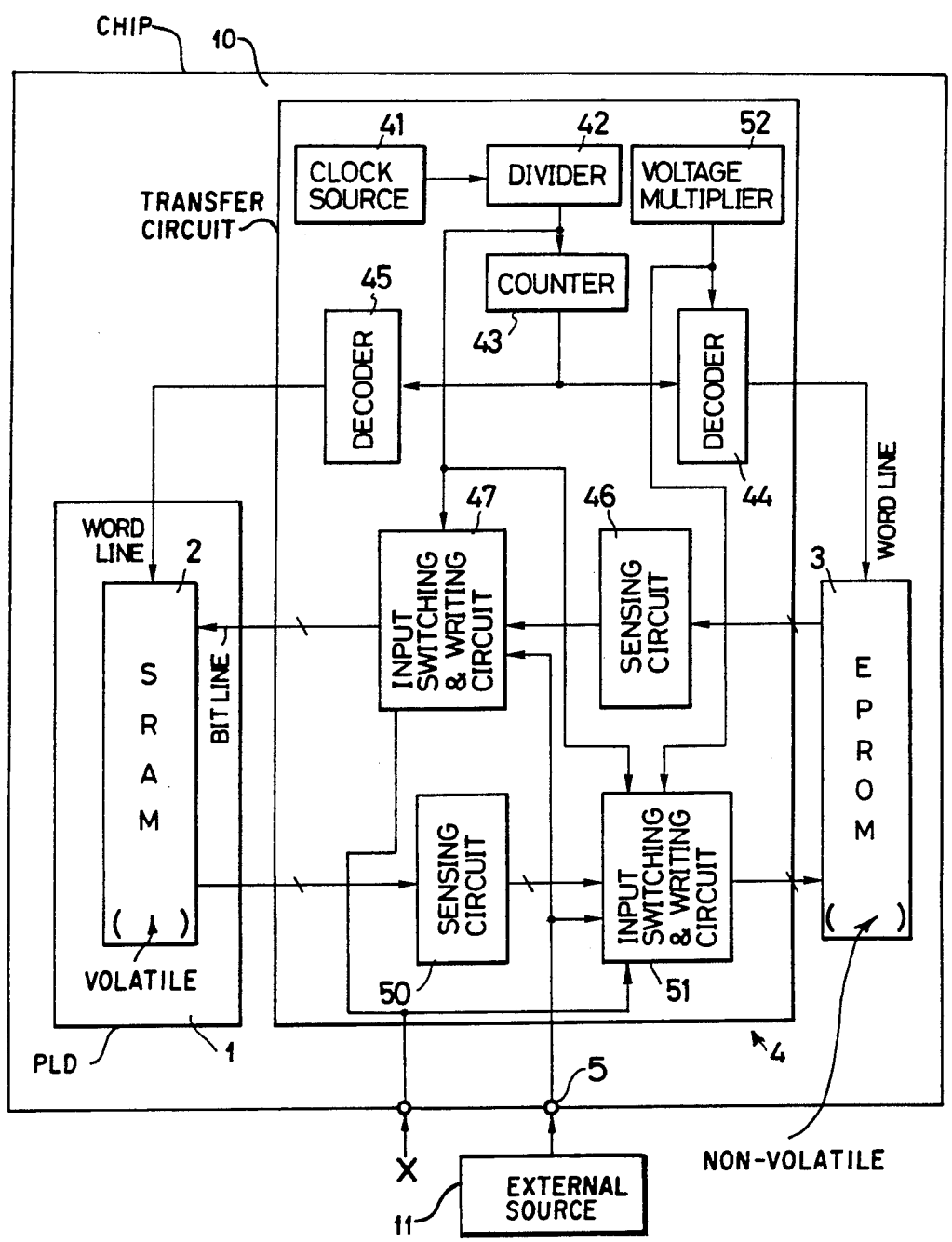
FIG. 2 is a block diagram illustrating the construction of a second embodiment of the present invention.

The second embodiment, shown in FIG. 2, includes in the transfer circuit 4 in the same integrated circuit as the first embodiment; a sensing second circuit 50 for reading data from the SRAM 2 in synchronism with the second clock signal; a second input switching/writing circuit 51 responsive to a control signal generated externally of the chip 10, for selecting either program data read by the second sensing circuit 50 or program data from an external source; and a voltage multiplier 52 connected to the second input switching/writing circuit 51 for generating the high voltages required by the EPROM 3, all for transferring the program data stored in the SRAM 2 to the EPROM 3.

The second embodiment is otherwise constructed the same as the first embodiment, and the description thereof will thus be omitted.

In the present embodiment, any program data stored in the SRAM 2 can be transferred to the EPROM 3. Therefore, in circuit evaluation, such as during a shipping inspection or in-circuit emulation, program data concerning a circuit is directly stored in the SRAM 2 from an external source 11 such as a developing tool, etc., without using the EPROM 3 for each test. Once a particular PLC configuration has been evaluated, debugged and finalized, the corresponding program data therefor can be written back to the EPROM 3 as it is, from the SRAM 2 immediately upon completion of the testing. Thus, since the writing operation from the SRAM 2 to the EPROM 3 is rapid and easy design and inspection efficiency are increased.

Further, although in the above embodiments the present invention was applied to a PLD, the present invention is applicable, without limitation thereto, to integrated circuits each including a variety of programmable circuits such as programmable digital signal processors and the like.

Although certain preferred embodiments have been shown and described, it should be understood that many changes and modifications may be made therein without departing from the scope of the appended claims.

What is claimed is:

1. An integrated circuit comprising:
   (a) a volatile memory device disposed in a programmable circuit on a chip for storing program data concerning said programmable circuit;
   (b) a non-volatile memory device disposed externally of said programmable circuit on said chip, said non-volatile memory device permitting said program data to be written therein from a write source external to said chip, and;
   means for selectively transferring to said volatile memory device either program data written in said non-volatile memory device, or program data supplied from a terminal connectable to a data source external to said chip.

2. An integrated circuit according to claim 1 wherein said means for transferring program data comprises
   a clock source for producing a first clock signal;
   a frequency divider circuit for dividing said first clock signal to produce a second clock signal;
   a counter for counting said second clock signal and generating an address in synchronism with said second clock signal;
   a first decoder for decoding said address as a read address to select a word line of said non-volatile memory device;
   a second decoder for decoding said address as a write address to select a word line of said volatile memory device;
   a sensing circuit for reading the data stored in said non-volatile memory device in synchronism with said second clock signal;
   an input switching/writing circuit for selecting either the program data read by said sensing circuit or program data from the external data source responsive to a control signal generated externally of said chip for driving a bit line of said volatile memory device.

3. An integrated circuit according to claim 1 wherein said means for transferring program data includes a circuit for transferring the program data stored in said volatile memory device to said non-volatile memory device.

4. An integrated circuit according to claim 3 wherein said circuit for transferring the program data stored in said volatile memory device to said non-volatile memory device comprises a second sensing circuit for reading the data stored in said volatile memory device in synchronism with said second clock signal, a second input switching/writing circuit responsive to a control signal generated externally of said chip for selecting either program data read by said second sensing circuit or program data from the external data source, and a voltage multiplier connected to said second input switching/writing circuit for generating high write voltages for said non-volatile memory device.

* * * * *